United States Patent [19]

Sugawara

[11] Patent Number: 5,159,285

[45] Date of Patent: Oct. 27, 1992

[54] DIFFERENTIAL AMPLIFYING CIRCUIT HAVING EMITTER FOLLOWER CIRCUIT

[75] Inventor: Mitsutoshi Sugawara, Tokyo, Japan

[73] Assignee: NEC Corporation, Tokyo, Japan

[21] Appl. No.: 731,231

[22] Filed: Jul. 17, 1991

[30] Foreign Application Priority Data

Jul. 17, 1990 [JP] Japan .................................. 2-188552

[51] Int. Cl.$^5$ ............................................. H03F 3/45
[52] U.S. Cl. .................................... 330/252; 330/261
[58] Field of Search ............... 330/252, 261, 296, 301, 330/310

[56] References Cited

U.S. PATENT DOCUMENTS 3,790,897  2/1974  Wheatley, Jr. ....................... 330/261
4,105,942  8/1978  Henry .................................. 330/261

FOREIGN PATENT DOCUMENTS 0047467  4/1979  Japan .................................. 330/261

Primary Examiner—Steven Mottola
Attorney, Agent, or Firm—Sughrue, Mion, Zinn, Macpeak & Seas

[57] ABSTRACT

A differential amplifying circuit includes two transistors, which are connected at collectors respectively to first terminals of two load resistors and at emitters respectively to a constant current source. An emitter follower transistor is commonly connected at a collector to second terminals of the two resistors and to a positive terminal of a direct current power supply, and at an emitter to a base of one of the two transistors. An input signal is supplied to the base of the emitter follower transistor and then supplied to the base of the transistor which is connected therewith. A differential output is picked up at the collectors of the two transistors. In this circuit, the emitter follower transistor is biased by the constant current source which also biases the two transistors of the differential amplifying circuit.

6 Claims, 5 Drawing Sheets

DIFFERENTIAL AMPLIFYING CIRCUIT HAVING EMITTER FOLLOWER CIRCUIT

FIELD OF THE INVENTION

This invention relates to a differential amplifying circuit, and more particularly to a differential amplifying circuit provided with at least one emitter follower circuit connected to an input thereof.

BACKGROUND OF THE INVENTION

A conventional differential amplifying circuit includes first and second transistors, first and second load resistors and a first constant current source. Such circuit is usually provided with an emitter follower circuit connected to an input of the amplifying circuit for increasing an input impedance thereof.

The first and second transistors are commonly connected at their emitters with the first constant current source, and commonly connected at their bases with emitters of first and second emitter follows transistors, respectively. The first and second load resistors are connected at first terminals to collectors of the first and second transistors, respectively, and commonly connected at second terminals to a positive terminal of a direct current power supply. The first and second emitter follower transistors are also commonly connected at their collectors to the positive terminal of the direct current power supply connected, at their base to a signal source in which positive and negative components are supplied to the bases of the first and second emitter follower transistors respectively, and connected at emitters to second and third constant current sources, respectively. The first through third constant current sources are commonly connected to a negative terminal of the direct current power supply.

In operation, an input signal is supplied differentially to the bases of the emitter follower transistors with bias voltage, and is amplified by the first and second transistors to be supplied to first and second output terminals provided at the collectors of the first and second transistors, respectively. In general, the outputs of the terminals may be amplified differentially in a differential amplifying circuit of the next stage.

According to the conventional differential amplifying circuit, however, there is a disadvantage in that the second and third constant current sources for driving the emitter follower transistors consume a considerable amount of power which is a multiple of the current flowing through the constant current sources and a voltage of the direct current power supply.

In case of the circuit used in a high frequency (1 GHz, for example) range, the constant current sources are required to produce currents sufficient for discharging a suspended capacity of the differential amplifying circuit and an input capacity of a differential amplifying circuit of the next stage, so that the currents may become 10 mA in some cases. In the case of the circuit used as a low noise amplifier, the constant current sources are required to produce currents sufficient for reducing shot noises to a predetermined level (it is known that the noise power level is inversely proportional to the current).

Further, a problem may occur, if the input bias current thereof is large. If the input signal source is an output of a magnetic head of a magnetic recording device such as a floppy disk drive, mis-writing operation may occur in reproducing mode, so that recorded signals may be unable to be reproduced, because of an offset of the input bias current. Therefore, the input bias current should be a low level. On the other hand, the constant current of the constant current source which supplies a bias current of the differential amplifying circuit is required to be a sufficiently large current in considering the gain, and noise and frequency characteristics.

Such a disadvantage may cause a short-life of batteries in a circuit driven by batteries or decrease of integration of LSIs to reduce a power consumption within an allowable loss thereof.

SUMMARY OF THE INVENTION

Accordingly, it is an object of the invention to provide a differential amplifying circuit in which consumption power is reduced.

According to a feature of the invention, a differential amplifying circuit comprises:
first and second transistors for differentially amplifying an input signal;
first and second load elements;
a constant current source; and
an emitter follower transistor; wherein:
the first and second transistors are commonly connected at their emitters to the constant current source and connected at their collectors to first terminals of the first and second load elements, respectively;
the first transistor is connected at a base to an emitter of said emitter follower transistor;
the first and second load elements are connected commonly at second terminals to an emitter of the emitter follower transistor; and
the emitter follower transistor is connected to a signal source for supplying the input signal thereto with a bias voltage.

BRIEF DESCRIPTION OF THE DRAWINGS

The invention will be explained in more detail in conjunction with the appended drawings wherein.

DESCRIPTION OF THE PREFERRED EMBODIMENTS

Figure 1:
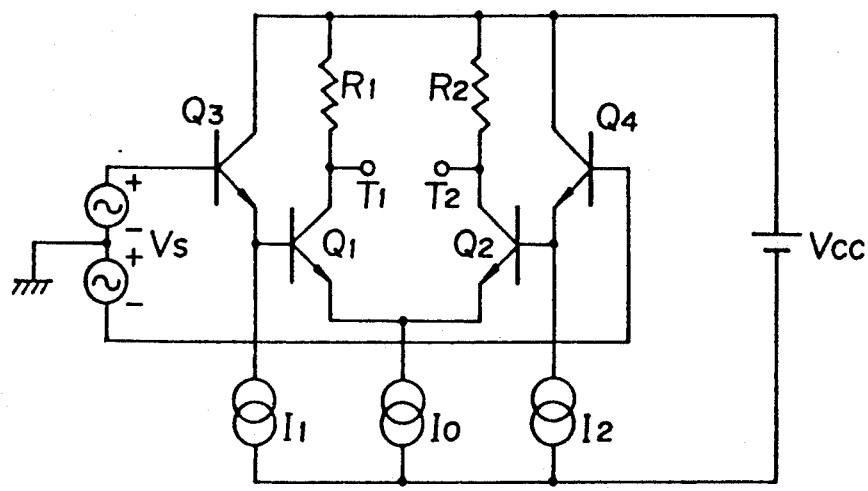
FIG. 1 is a circuit diagram of a conventional differential amplifying circuit.

Before describing a differential amplifying circuit in the preferred embodiments according to the invention, the conventional differential amplifying circuit described above will be explained in conjunction with FIG. 1.

The conventional differential amplifying circuit includes first and second transistors $Q_1$ and $Q_2$, first and second load resistances $R_1$ and $R_2$, and a first constant current source $I_0$.

The first and second transistors $Q_1$ and $Q_2$ are commonly connected at their emitters with the first constant current source $I_0$, and at their bases with emitters of first and second emitter follower transistors $Q_3$ and $Q_4$, respectively. The first and second load resistors $R_1$ and $R_2$ are connected at first terminals to collectors of the first and second transistors $Q_1$ and $Q_2$, and commonly connected at second terminals to a positive terminal of a direct current power supply $V_{cc}$. The first and second emitter follower transistors $Q_3$ and $Q_4$ are commonly connected at their collectors to the positive terminal of the direct current power supply $V_{cc}$, the emitter follower transistors are connected at bases with a signal source $V_3$ in which positive and negative components are supplied to the bases of the first and second emitter follower transistors $Q_3$ and $Q_4$ respectively, and connected at their emitters to second and third constant current sources $I_1$ and $I_2$, respectively. The first through third constant current sources $I_0$ to $I_2$ are commonly connected to a negative terminal of the direct current power supply $V_{cc}$. Outputs of first and second output terminals $T_1$ and $T_2$ provided at the collectors of the first and second transistors $Q_1$ and $Q_2$, respectively, are supplied to an external circuit.

In operation, an input signal $V_8$ is applied differentially to the bases of the emitter follower transistors $Q_3$ and $Q_4$ with a bias voltage. Though the input signal is attenuated slightly at the first and second emitter follower transistors $Q_1$ and $Q_2$, however, the input signal is amplified at the first and second transistors $Q_1$ and $Q_2$, and is supplied to the first and second output terminals $T_1$ and $T_2$ differentially. In general, the outputs of the terminals $T_1$ and $T_2$ are amplified differentially by a differential amplifying circuit of the next stage (not shown).

Next, a differential amplifying circuit in a first preferred embodiment will be explained in conjunction with FIG. 2.

The differential amplifying circuit includes first and second transistors $Q_6$ and $Q_7$, first and second load resistors $R_3$ and $R_4$, and a first constant current source $I_3$. The first and second transistors $Q_6$ and $Q_7$ are commonly connected at their emitters with the first constant current source $I_3$. The first and second load resistors $R_3$ and $R_4$ are connected at first terminals to collectors of the first and second transistors $Q_6$ and $Q_7$ respectively, and commonly connected at second terminals to a positive terminal of a direct current power supply $V_{cc}$. The first transistor $Q_6$ is connected at a base to an emitter of an emitter follower transistor $Q_5$. The emitter follower transistor $Q_5$ is connected at its collector to the positive terminal of the direct current power supply $V_{cc}$ connected, at a base to a signal source $V_5$ in which a positive component is supplied thereto, and commonly connected at an emitter to second terminals of the first and second resistors $R_3$ and $R_4$. The second transistor $Q_7$ is connected at a base to a bias power supply $V_s$ from which a predetermined level of a bias voltage is applied thereto. A negative terminal of the direct current power supply $V_{cc}$ is connected to the constant current source $I_3$.

In operation, an input signal $V_8$ including a DC bias voltage is applied to the base of the emitter follower transistor $Q_5$. The input signal is amplified by the first transistor $Q_6$ and supplied to first output terminal $T_1$ provided at the collectors of the first and second transistors $Q_6$ and $Q_7$.

In this differential amplifying circuit, there occurs direct current drop over the first and second resistors $R_3$ and $R_4$. Therefore, a value of the first resistor $R_3$ should be determined so that a voltage $V_{CE}$ between the collector and the emitter of the first transistor $Q_6$ becomes at least 0.1 V (preferably in the range of 0.2 V to 0.5 V). The voltage $V_{CE}$ is obtained by the following formula:

$$V_{CE} = V_{BE} - I_3 R_3/2$$

where $V_{BE}$ is a voltage between the base and the emitter of the first transistor $Q_5$. Such a condition can be realized by setting the same conditions as like in an internal gate circuit of an ECL (Emitter Coupling Logic) circuit.

In this embodiment, a sum of collector currents of the first and second transistors $Q_6$ and $Q_7$, which is a bias current of the emitter follower transistor $Q_5$, is approximately equal to a sum of emitter currents thereof which is equal to the constant current flowing through the constant current source $I_3$, because each of the base currents thereof is small as compared to the collector currents. Therefore, the emitter follower transistor $Q_5$ is biased by the constant current source $I_3$, so that it is not necessary to provide an additional current source for biasing the emitter follower transistor $Q_5$.

Though there is no problem when the outputs are picked up from the first and second output terminals $T_1$ and $T_2$ differentially, the outputs become values of (gain $-1$) in the first terminal $T_1$ and (gain $+1$) in the second terminal $T_2$ respectively if the output is picked up from only one of either of the first and second terminals $T_1$ and $T_2$, because an alternative signal corresponding to the input signal is supplied to both terminals.

Next, a differential amplifying circuit in the second preferred embodiment will be explained in conjunction with FIG. 3. The circuitry structure of the differential amplifying circuit is the same as that in FIG. 2, except that the circuit is further provided with a transistor $Q_8$ and two resistors $R_5$ and $R_6$. The transistor $Q_8$ is connected at its base to ground, at collector to a positive terminal of a direct current power supply $V_{cc}$, and commonly connected at an emitter to the first terminals of the resistors $R_5$ and $R_6$. The resistors $R_5$ and $R_6$ are connected at second terminals to collectors of the first and second transistors $Q_6$ and $Q_7$.

In this differential amplifying circuit, the proportion of a bias currents of the emitter follower transistor $Q_5$ and that of the first and second transistors $Q_6$ and $Q_7$ are adjusted to be adequate by providing the transistor $Q_8$ and the resistors $R_5$ and $R_6$. Now, it is supposed that the adequate level of the bias current of the emitter follower transistor $Q_5$ is 2.5 mA and a constant current of the constant current source $I_3$ is 2.5 mA. Such a condition can be realized by setting the base voltage level of the transistor $Q_5$ as the same level of the DC bias voltage level of that of the emitter follower transistor $Q_5$ and setting each of the resistances $R_3$ to $R_6$ to have the same resistance, when the differential amplifying circuit is biased. In such a case, the same amount of current, that is 1.25 mA, flows through each of the resistors $R_3$ to $R_6$, so that the current of the emitter follower transistor $Q_5$ becomes 2.5 mA, which is a sum of currents flowing through the resistors $R_3$ and $R_4$. Consequently, the adequate level of current flows through the emitter follower transistor $Q_5$, so that the emitter follower transistor $Q_5$ does not consume an excess of power.

Figure 4:
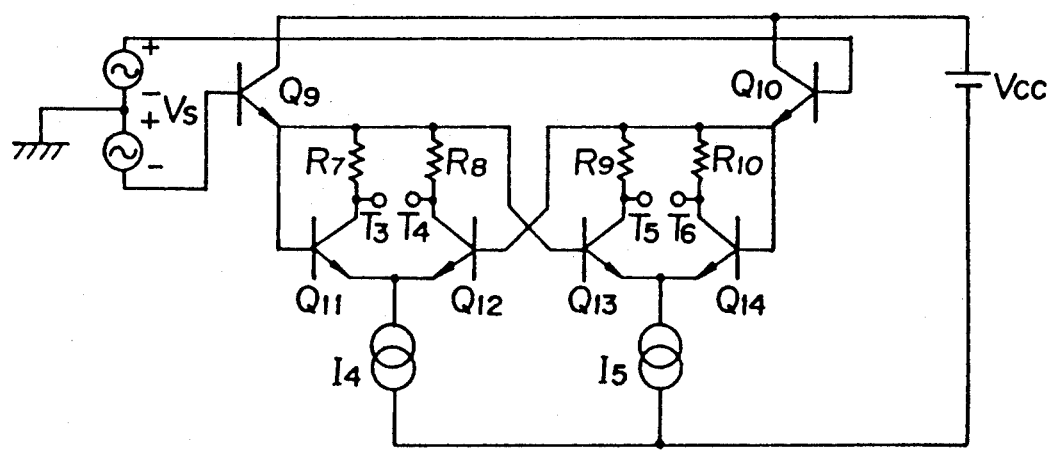
FIG. 4 is a circuit diagram of a differential amplifying circuit in a third preferred embodiment according to the invention.

Next, a differential amplifying circuit in a third preferred embodiment will be explained in conjunction with FIG. 4. In this embodiment, first and second units each composing a differential amplifying circuit are provided in parallel. The first unit includes two transistors $Q_{11}$ and $Q_{12}$, two load resistors $R_7$ and $R_8$ and a constant current source $I_4$, while the second unit includes two transistors $Q_{13}$ and $Q_{14}$, two load resistors $R_9$ and $R_{10}$ and a constant current source $I_5$. Each of the two units has the same circuitry structure which is the same as the differential amplifying circuit in FIG. 2. Emitter follower transistors $Q_9$ and $Q_{10}$ are also provided. The emitter follower transistors $Q_9$ and $Q_{10}$ are differentially supplied at their bases with an input signal as in FIG. 1, in which a positive component of the input signal to the base of the emitter follower transistor $Q_9$ and a negative component of the input signal to the base of the emitter follower transistor $Q_{10}$. The emitter follower transistor $Q_9$ is connected at its emitter to bases of the transistors $Q_{11}$ and $Q_{13}$ and the resistors $R_6$ and $R_7$. On the other hand, the emitter follower transistor $Q_{10}$ is connected at an emitter to bases of the transistors $Q_{12}$ and $Q_{14}$ and the resistors $R_9$ and $R_{10}$. A direct current power supply $V_{cc}$ is connected at a positive terminal to collectors of the emitter follower transistors $Q_9$ and $Q_{10}$, and at a negative terminal to the constant current sources $I_4$ and $I_5$. Output terminals $T_3$ through $T_6$ are provided at collectors of the transistors $Q_{11}$ through $Q_{14}$, respectively, from which outputs of the differential amplifying circuit are picked up.

In this embodiment, there are several ways for picking up outputs of the differential amplifying circuit. In the first way, a differential voltage level between the output terminals $T_3$ and $T_4$ and a differential voltage level between the output terminals $T_5$ and $T_6$ are picked up, respectively, and then the two differential voltage levels are summed to be an output of the circuit. In practice, the differential outputs of the output terminals $T_3$ and $T_4$ are supplied to inputs of a first differential amplifying circuit of the next stage, (not shown) while the differential outputs of the output terminals $T_5$ and $T_6$ are supplied to inputs of a second differential amplifying circuit of the next stage (not shown). Then outputs of the first and second differential amplifying circuit of the next stage are summed. In the second way, an output picked up from the output terminals $T_3$ and $T_5$ which are connected to each other and an output picked up from the output terminals $T_4$ and $T_6$ which are connected to each other are differentially picked up.

In the third way, only one differential output of either the output terminals $T_3$ and $T_4$ or the output terminals $T_5$ and $T_6$ is picked up. In the fourth way, only one differential output of either the output terminals $T_4$ and $T_5$ or the output terminals $T_3$ and $T_6$ is picked up. In the fifth way, only one output of either of the four terminals $T_3$ to $T_6$ is picked up.

Figure 2:
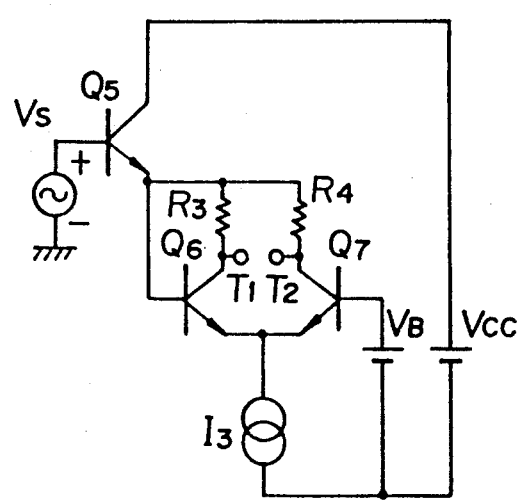
FIG. 2 is a circuit diagram of a differential amplifying circuit in a first preferred embodiment according to the invention.

In any case, the circuit may have the same power consumption, and frequency and noise characteristics as those in FIG. 2 on conditions that constant currents of the constant current source $I_4$ and $I_5$ are both equal to half of the constant current of the constant current source $I_3$ in FIG. 2, resistors of all of the load resistances $R_7$ through $R_{10}$ are equal to a doubled value of the load resistor $R_3$ in FIG. 2, and each size of all of the transistors $Q_{11}$ through $Q_{14}$ is equal to half of that of the transistor $Q_6$ in FIG. 2.

Figure 5:
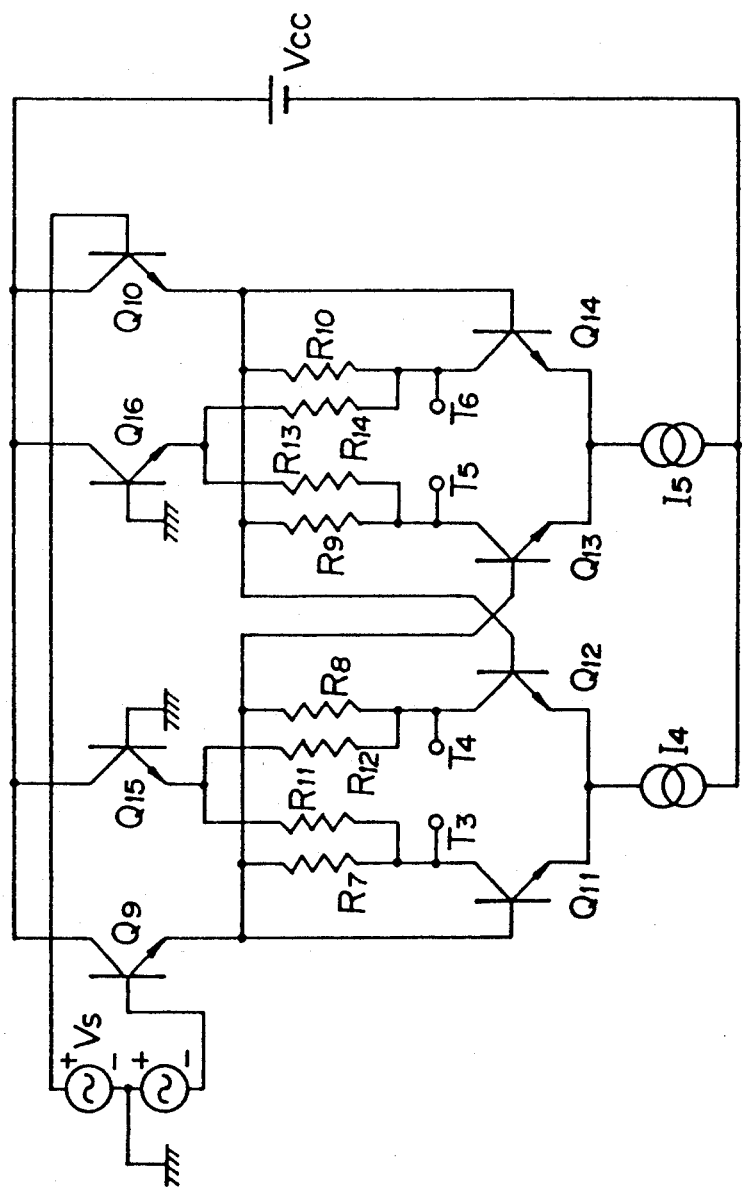
FIG. 5 is a circuit diagram of a differential amplifying circuit in a fourth preferred embodiment according to the invention.

Next, a differential amplifying circuit in a fourth preferred embodiment will be explained in conjunction with FIG. 5. The circuitry structure of the differential amplifying circuit is the same as that in FIG. 4, except that the circuit is further provided with two transistors $Q_{15}$ and $Q_{16}$ and four resistors $R_{11}$ through $R_{14}$. The transistor $Q_{15}$ is connected at its base to ground, at its collector to a positive terminal of a direct current power supply $V_{cc}$, and commonly connected at its emitter to first terminals of the resistors $R_{11}$ and $R_{12}$. The resistors $R_{11}$ and $R_{12}$ are connected at second terminals to the collectors of the transistors $Q_{11}$ and $Q_{12}$. On the other hand, the transistor $Q_{16}$ is connected at its base to ground, at its collector to the positive terminal of the direct current power supply $V_{cc}$, and commonly connected at its emitter to first terminals of the resistors $R_{13}$ and $R_{14}$. The resistors $R_{13}$ and $R_{14}$ are connected at second terminals to the collectors of the transistors $Q_{13}$ and $Q_{14}$.

Figure 3:
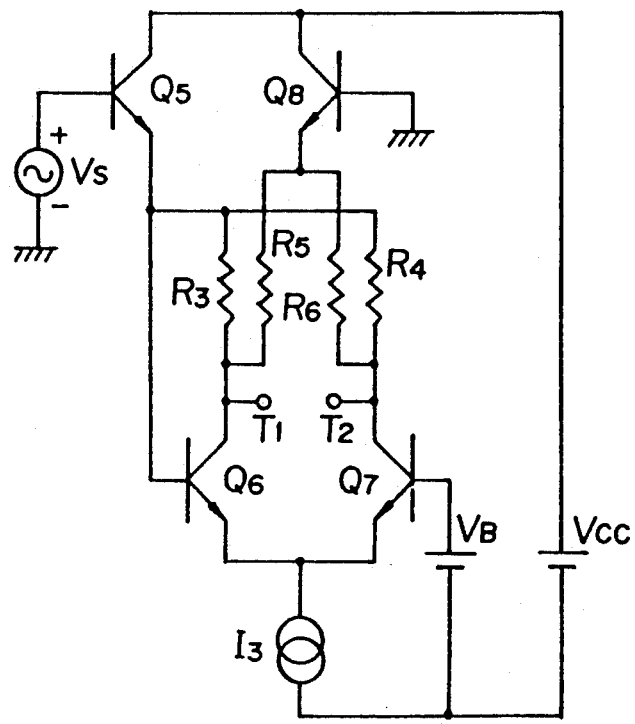
FIG. 3 is a circuit diagram of a differential amplifying circuit in a second preferred embodiment according to the invention.

In this differential amplifying circuit, the proportion of bias currents of the emitter follower transistors $Q_9$ and $Q_{10}$ and those of the transistors $Q_{11}$ to $Q_{14}$ are adjusted by providing the transistors $Q_{15}$ and $Q_{16}$ and the resistors $R_{11}$ to $R_{14}$ like the transistor $Q_8$ and resistors $R_5$ and $R_6$ in FIG. 3.

Figure 6:
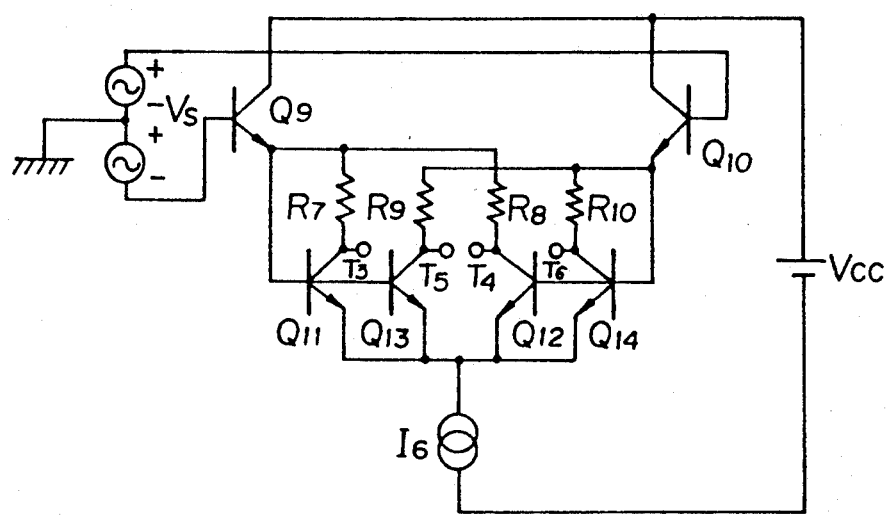
FIG. 6 is a circuit diagram of a differential amplifying circuit in a fifth preferred embodiment according to the invention.

Next, a differential amplifying circuit in a fifth embodiment will be explained in conjunction with FIG. 6. In this embodiment, the circuitry is the same as that in FIG. 4, except that the transistors $Q_{11}$ and $Q_{13}$ and the transistors $Q_{12}$ and $Q_{14}$ are short-circuited respectively and the two constant current sources $I_4$ and $I_5$ are replaced by a constant current source $I_6$. In FIG. 4, the common signals are supplied to the transistors $Q_{11}$ and $Q_{13}$ and the transistors $Q_{12}$ and $Q_{14}$, respectively, so that the same signals are generated at the emitters of the transistors $Q_{11}$ and $Q_{13}$ and at the emitters of the transistors $Q_{12}$ and $Q_{14}$. Therefore, the differential amplifying circuit has the same equivalent circuit structure as that in FIG. 4, so that operation thereof is the same as that in FIG. 4.

Figure 7:
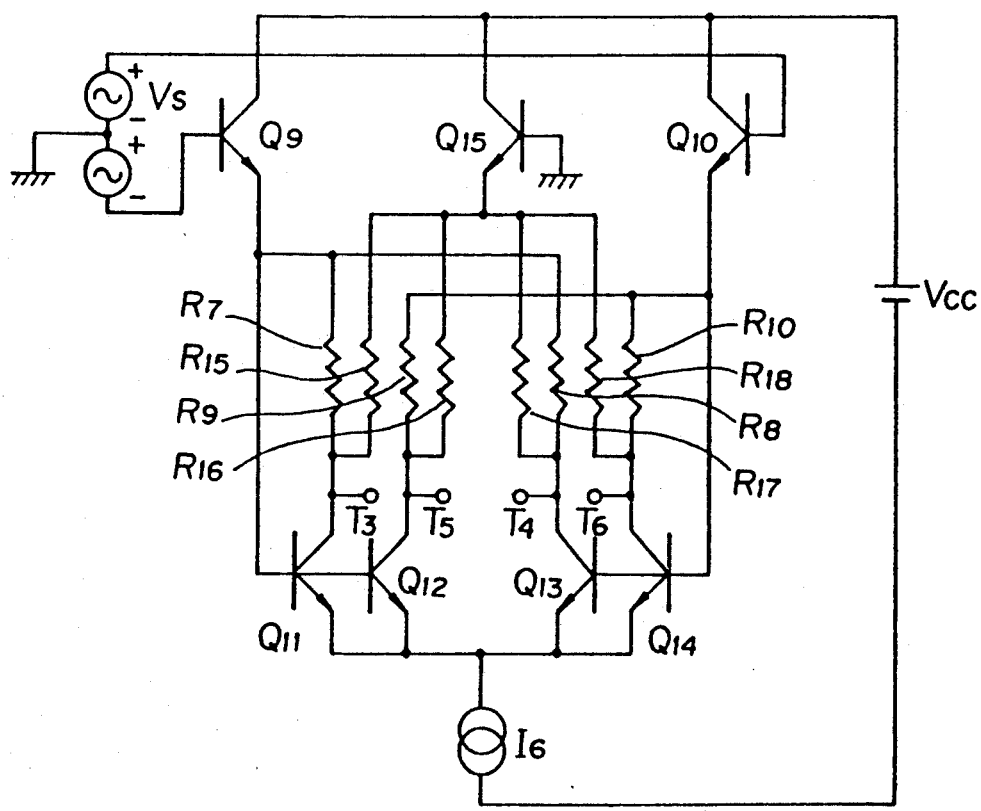
FIG. 7 is a circuit diagram of a differential amplifying circuit in a sixth preferred embodiment according to the invention.

Next, a differential amplifying circuit in a sixth embodiment will be explained in conjunction with FIG. 7. In this embodiment, the circuitry structure is the same as that in FIG. 6, except that the differential amplifying circuit is further provided with a transistor $Q_{15}$ and four load resistors $R_{15}$ to $R_{18}$. The transistor $Q_{15}$ is connected at its base to ground, at its collector to a positive terminal of a direct current power supply $V_{cc}$, and commonly connected at an emitter to first terminals of the resistors $R_{15}$ through $R_{16}$. The resistors $R_{15}$ through $R_{18}$ are connected at second terminals to the collectors of the transistors $Q_{11}$ through $Q_{14}$. The transistor $Q_{15}$ functions a by-pass as like the transistor $Q_8$ in FIG. 3 or the transistors $Q_{15}$ and $Q_{16}$ in FIG. 5. The operation thereof is the same as that in FIG. 6.

Although the invention has been described with respect to specific embodiments for complete and clear disclosure, the appended claims are not so limited and alternative constructions that may be apparent to one skilled in the art fairly fall within the basic teaching herein set forth.

What is claimed is:

1. A differential amplifying circuit, comprising:

first and second transistors for differentially amplifying an input signal, including a DC bias voltage;
first and second load elements;
a constant current source; and
an emitter follower transistor, wherein
said first and second transistors are commonly connected at emitters to said constant current source, and connected at collectors to first terminals of said first and second load elements, respectively;
said first transistor is connected at a base to an emitter of said emitter follower transistor;
said first and second load elements are commonly connected at second terminals to an emitter of said emitter follower transistor; and
said emitter follower transistor is connected with a signal source for supplying said input signal including said DC bias voltage.

2. A differential amplifying circuit, according to claim 1, further comprising:
a third transistor connected at a base to ground and at a collector with a collector of said emitter follower transistor; and
third and fourth load elements commonly connected at first terminals to an emitter of said third transistor and second terminals to collectors of said first and second transistors.

3. A differential amplifying circuit according to claim 1, further comprising:
third and fourth transistors for differentially amplifying the input signal;
third and fourth load elements;
a second constant current source; and
a second emitter follower transistor, wherein said third and fourth transistors are commonly connected at emitters to said second constant current source, and connected at collectors to first terminals of said third and fourth load elements, respectively;
said third transistor being connected at a base to the second terminals of said first and second load elements, said fourth transistor being connected at a base to said emitter follower transistor; and
said third and fourth load elements being commonly connected at second terminals to an emitter of said second emitter follower transistor.

4. A differential amplifying circuit according to claim 3, further comprising:
a fifth transistor connected at a base to ground and connected at a collector with a collector of said emitter follower transistor; and
fifth and sixth load elements commonly connected at first terminals to an emitter of said fifth transistor and connected at second terminals to collectors of said first and second transistors, respectively.

5. A differential amplifying circuit according to claim 3, wherein the bases of said first and third transistors are connected together, and the bases of said second and fourth transistors are connected together.

6. A differential amplifying circuit according to claim 5, further comprising:
a fifth transistor connected at a base to ground and commonly connected at a collector with the collectors of said emitter follower transistor and said second emitter follower transistor; and
fifth, sixth, seventh and eighth load elements commonly connected at first terminals to an emitter of said fifth transistor and connected at second terminals to collectors of said first, second, third and fourth transistors, respectively.

* * * * *